United States Patent [19]
Kaminow et al.

[11] Patent Number: 5,524,014
[45] Date of Patent: Jun. 4, 1996

[54] OPTICAL FREQUENCY TRANSLATOR

[75] Inventors: Ivan P. Kaminow, Holmdel; Martin Zirngibl, Middletown, both of N.J.

[73] Assignee: AT&T Corp., Murray Hill, N.J.

[21] Appl. No.: 247,381

[22] Filed: May 23, 1994

[51] Int. Cl.$^6$ ........................................ H01S 3/10
[52] U.S. Cl. .................. 372/28; 372/23; 372/32; 385/14; 385/24
[58] Field of Search .................. 372/28, 23, 20, 372/32; 385/130, 24, 14

[56] References Cited

U.S. PATENT DOCUMENTS

| | | | |
|---|---|---|---|
| 4,410,992 | 10/1983 | Javan | 372/32 |
| 5,002,350 | 3/1991 | Dragone | 350/96 |
| 5,136,671 | 8/1992 | Dragone | 385/46 |
| 5,191,625 | 3/1993 | Gustavsson | 385/14 |
| 5,233,453 | 8/1993 | Sivarajan et al. | 385/130 |
| 5,280,549 | 1/1994 | Barnard et al. | 385/24 |
| 5,339,157 | 8/1994 | Glance et al. | 385/24 |
| 5,361,268 | 11/1994 | Fossey et al. | 372/23 |
| 5,367,586 | 11/1994 | Glance et al. | 385/24 |
| 5,373,516 | 12/1994 | Glance et al. | 372/20 |
| 5,373,517 | 12/1994 | Dragone et al. | 372/20 |
| 5,390,200 | 2/1995 | Zirnginbl | 372/20 |

*Primary Examiner*—Rodney B. Bovernick
*Assistant Examiner*—Yisun Song
*Attorney, Agent, or Firm*—Stuart H. Mayer

[57] ABSTRACT

An optical frequency translator includes a frequency routing device formed on a semiconductive wafer between two reflective facets forming a laser cavity. Waveguides associated with the device each contain an integrated optical amplifier selectively acting as a gate preventing the flow of optical energy through a respective waveguide or as a gain-providing element which amplifies optical energy flowing through a respective waveguide. When a selective one of the optical amplifiers is activated with bias current the optical energy produced by this current operates in conjunction with the optical energy of the input signal so that lasing action occurs between the reflective facets. The lasing action occurs along a predetermined path determined by the optical amplifier or amplifiers that are activated. The lasing action in this particular path is supported at a particular selected frequency. This particular frequency is the frequency to which the input signal is to be translated. An input waveguide is provided for injecting the input signal into the laser cavity. A separate output waveguide maybe provided. Alternatively, the input and output signals may be transmitted on the same waveguide. A gain member such as a saturable absorber, for example, may be disposed in the laser cavity which optically couples the input waveguide to the frequency routing device.

15 Claims, 2 Drawing Sheets

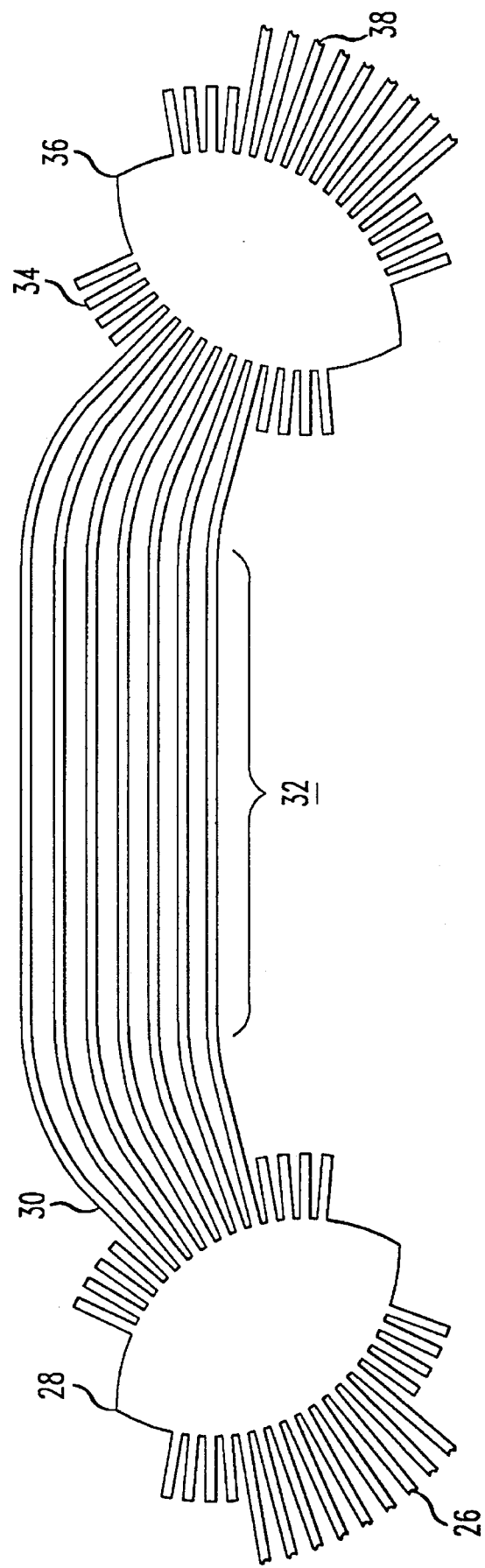

OPTICAL FREQUENCY TRANSLATOR

CROSS-REFERENCE TO RELATED APPLICATIONS

This application is related to application Ser. No. 08/019,961 of Bernard Glance and Robert Wilson, entitled "Rapidly Tunable Integrated Optical Filter," filed in the Patent and Trademark Office on Feb. 19, 1993.

This application is related to application Ser. No. 08/019,957 of Bernard Glance and Robert Wilson, entitled "Rapidly Tunable Wideband Integrated Optical Filter," filed in the Patent and Trademark Office on Feb. 19, 1993.

This application is related to application Ser. No. 08/019,951 of Bernard Glance and Robert Wilson, entitled "Rapidly Tunable Wideband Integrated Laser," filed in the Patent and Trademark Office on Feb. 19, 1993.

This application is related to application Ser. No. 08/019,952 of Corrado Dragone and Ivan Kaminow, entitled "Rapidly Tunable Integrated Laser," filed in the Patent and Trademark Office on Feb. 19, 1993.

TECHNICAL FIELD

This invention relates to optical communications systems. More particularly, this invention relates to an optical frequency translator used in optical communications systems.

BACKGROUND

The capacity and speed of communications systems may be increased by transmitting information in optical form over networks composed of optically transmissive nodes, fibers, waveguides, and the like. High capacity optical communications systems require that many optical signals be frequency division multiplexed in the components of an optical network. An important component for such a system is an optical frequency translator, which may be employed for a variety of signal processing purposes. An optical frequency translator can shift the optical carrier frequency while maintaining the data signal. In a communication system optical frequency translators are used in optical wavelength division multiplex cross-connect switches, for example.

One type of known optical frequency translator is composed of a tunable DBR or Y-branch laser that incorporates a saturable absorber or an optical gain section. However, the performance of these devices have been limited in terms of tuning speed, frequency selectivity, or tuning range. All of these prior devices also have been expensive to implement.

SUMMARY

In accordance with this invention, an optical frequency translator has been developed. This translator may be based upon photonic integrated circuitry which has a wide gain bandwidth. Such frequency translators can be realized at a cost lower than that needed to implement prior translators used in optical communications systems.

In one example of the invention, Applicants have realized that integrated optical multiplexers and demultiplexers may be used to create a frequency translator. Examples of such devices are disclosed in U.S. Pat. Nos. 5,002,350 and 5,136,671. In specific terms, one example of the invention comprises a frequency routing device formed on a semiconductive wafer between two reflective facets forming a laser cavity. Waveguides associated with the device each contain an integrated optical amplifier selectively acting as a gate preventing the flow of optical energy through a respective waveguide or as a gain-providing element which amplifies optical energy flowing through a respective waveguide. When a selective one of the optical amplifiers is activated with bias current the optical energy produced by this current operates in conjunction with the optical energy of the input signal so that lasing action occurs between the, reflective facets. The lasing action occurs along a predetermined path determined by the optical amplifier or amplifiers that are activated. The lasing action in this particular path is supported at a particular selected frequency. This particular frequency is the frequency to which the input signal is to be translated. An input waveguide is provided for injecting the input signal into the laser cavity. A separate output waveguide may be provided. Alternatively, the input and output signals may be transmitted on the same waveguide. A gain member such as a saturable absorber, for example, may be disposed in the laser cavity which optically couples the input waveguide to the frequency routing device.

This is only an example of the invention. The full scope of the invention entitled to an exclusionary right is set forth in the claims at the end of this application.

BRIEF DESCRIPTION OF THE DRAWINGS

FIG. 2 is a diagram illustrating the details of the frequency routing device shown in FIG. 1.

DETAILED DESCRIPTION

Figure 1:
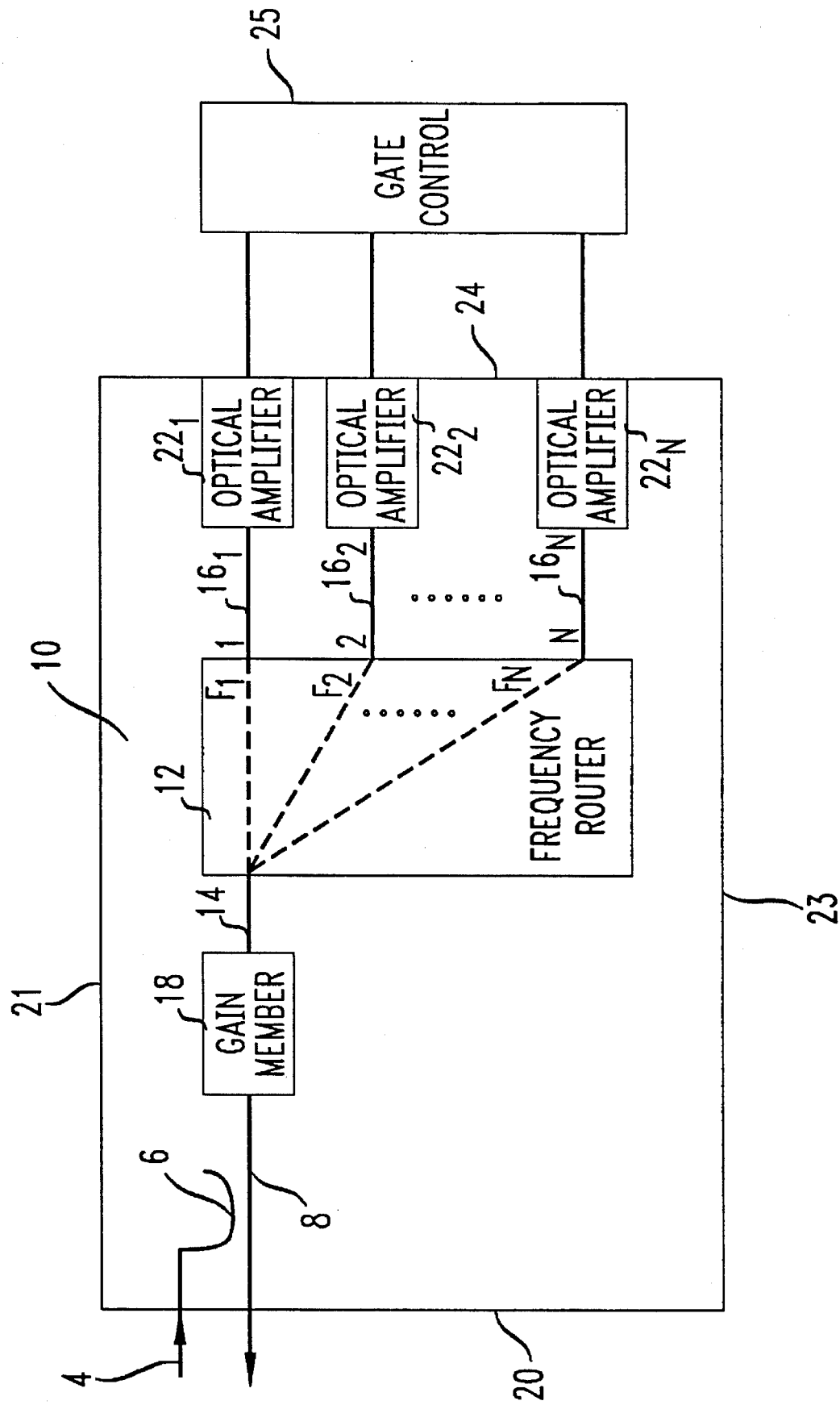
FIG. 1 is a diagram of an example of an optical frequency translator in accordance with this invention.

FIG. 1 shows an example of an optical frequency translator. It is composed of a frequency routing device for providing frequency selectivity, a number of waveguides for carrying optical signals, and a number of optically active sections for providing optical amplification and lasing behavior. These structures may be monolithically integrated on a semiconductive wafer. They may be created by means of known photolithographic techniques.

FIG. 1 illustrates a wafer 10 made of a semiconductive material such as an indium phosphide based material such as InGaAsP. An NxN frequency routing device 12 is defined on the wafer 10. An input waveguide 4 is directed through a cleaved facet 20 formed in the semiconductor wafer 10 and is coupled to an output waveguide 8 via a directional coupler 6. The output waveguide 8 is also directed through the cleaved facet 20 and is connected to a gain member 18. The gain member 18 may be either a saturable absorber or optical amplifier 18. A waveguide 14 has one end connected to the gain member 18 and another end connected to one end of the frequency routing device 12. A plurality of waveguides $16_1$, $16_2$, ..., $16_N$ is connected to another end of the frequency routing device 12. A plurality of optical amplifiers $22_1$, $22_2$, ..., $22_N$ connects respective ones of the plurality of waveguides $16_1$, $16_2$, ..., $16_N$ to a second cleaved facet 24 formed in the wafer 10. The two cleaved facets 20 and 24 comprise at least partially reflective mirrors defining a tuned cavity in which lasing action can be supported. While the cleaved facet 24 may be a highly reflective surface, the cleaved facet 20 should be only partially reflective so that the output signal directed on waveguide 8 can be transmitted therethrough. A gate control circuit 25 selectively provides bias current to predetermined ones of the optical amplifiers.

Each optical amplifier comprises a doped section of waveguide with controllable optical transmissivity. The doping may be such that an appropriately configured semiconductor junction is defined in each optical amplifier. These sections are optically active in that application of electrical energy to those sections will cause them to become transmissive to the flow of optical energy and will even provide some degree of gain to optical signals flowing through them. When electrical bias current above a lasing threshold is applied, laser action begins. These doped sections of waveguide are substantially opaque to the transmission of light when there is no applied electrical stimulation. The specially doped sections thus may be considered to be attenuators or optical amplifiers depending upon whether or not they are excited with electrical energy. The details of creating such sections in a wafer such as the wafer 10 shown in FIG. 1 are generally known, are not a part of this invention, and thus are not described here.

Selectively applying bias current to predetermined ones of the optical amplifiers $16_1, 16_2, \ldots 16_N$ will create certain frequency selective optical pathways between the cleaved facets 20 and 24 due to the behavior of the frequency routing device 12. Application of a certain amount of bias current above a lasing threshold to the selected ones of the optical amplifiers will cause lasing action at a frequency supported in the frequency selective optical pathways. Those optical amplifiers which are not given any bias current remain opaque to the transmission of optical energy through them.

The frequency routing device 12 is such that an optical signal having a frequency $F_i$ appearing on the waveguide $16_1$ and flowing toward the device 12 will be directed to the waveguide 14. An optical signal having a frequency $F_2$ appearing on the waveguide $16_2$ will be directed toward the frequency routing device 12, also on waveguide 14. In general, an optical signal having a frequency $F_1$ appearing on waveguide $16_1$ and flowing toward the device 12 will be directed to waveguide 14 by the frequency routing device 12. Similarly, due to the symmetrical nature of the frequency routing device, an optical signal having a frequency $F_i$ appearing on waveguide 14 and flowing toward the frequency routing device 12 will be directed to waveguide $16_i$.

The amplifiers $22_1, 22_2, \ldots, 22_N$ are used as gates opened by the bias current. When these gates are biased by a current of 10 to 20 mA, for example, they become optically transparent with perhaps some gain depending on the level of the bias current. The optical amplifiers are highly optically lossy at a zero bias current. One of these optical amplifiers $22_1, 22_2, \ldots 22_N$ is biased so that it is optically transmissive while the remaining optical amplifiers $22_1, 22_2, \ldots, 22_N$ are unbiased to absorb any light reaching them. Assuming the gain member 18 is optically transmissive, application of a bias current to one of the optical amplifiers $22_1, 22_2, \ldots, 22_N$ in this manner determines a transparent route between the mirrors for lasing action. Along this route, stationary waves can be sustained for frequencies within a passband associated with this route. Frequencies outside this passband are suppressed by the lossy unbiased optical amplifiers. Lasing can occur at the Fabry-Perot mode whose frequency is nearest the passband maximum. Adjacent Fabry-Perot modes are suppressed by passband selectivity which can be adjusted by appropriate circuit design.

For those embodiments of the invention in which the gain member 18 comprises a saturable absorber, the operation of the frequency translator is as follows. If it is desired to translate an input signal having a frequency $F_1$ with data bits D, for example, to a different frequency, say $F_2$, also with data bits D, bias current is applied to optical amplifier $22_2$ just at or slightly above the threshold level of the laser cavity. The absorber 18 is initially underpumped and hence maybe substantially opaque or slightly transmissive. When an optical data bit of the input signal is injected into the device via input waveguide 4 and then coupled into the output waveguide 8 via the directional coupler 6, the absorber 18 is saturated and becomes more transparent, thus allowing lasing action to begin at a frequency $F_2$. In this manner the data bits D are translated to the frequency $F_2$, which are directed to output waveguide 8. Accordingly, the input signal can be translated to any of the frequencies $F_1, F_2, \ldots F_N$ by properly biasing the appropriate optical amplifier $22_1, 22_2, \ldots, 22_N$ as illustrated above for the case of frequency $F_2$.

Those embodiments of the invention in which the gain member 18 comprises an optical amplifier operate in a similar manner to the embodiment discussed above. However, because in this case the gain member 18 is biased so that an input signal causes the optical amplifier to decrease in gain, the output signal at the new, translated frequency is the logical complement of the input signal.

One advantage provided by the frequency translator of this invention is that any residual input signal not absorbed by the gain member 18 will be absorbed by one of the optical amplifiers $22_1, 22_2, \ldots, 22_N$ that are optically opaque. For instance, in the example discussed above for which the input signal at a frequency $F_1$ is translated to a signal at frequency $F_2$, any residual input signal will be absorbed by the optical amplifier $22_1$ since it is biased at zero or near zero current. As a result, there is no need to filter out residual signals.

As noted above, the cleaved facet 24 may be high reflecting while the cleaved facet 20 should be partially reflecting so that the output signal can be transmitted therethrough. High reflectivity may be achieved by coating the surface with an anti-reflective coating. In an alternative embodiment of the invention, the cleaved facet 20 is also high reflecting except in the vicinity of the output waveguide 8. This can be accomplished by coating only a portion of the cleaved facet 20 with an anti-reflective coating. Alternatively, the input waveguide may enter the cavity through one of the lateral surfaces 21 and 23 rather than through the cleaved facet 20. In this case the entirety of cleaved facet 20 may be highly reflective. Regardless of the surface through which the input signal is directed, a gain section may be provided on input waveguide 4 to amplify the input signal before it reaches the directional coupler 6.

In another alternative embodiment of the invention, the input waveguide 4 may be eliminated so that the input signal and the output signal are directed on the same waveguide 8.

FIG. 2 shows the pertinent details of an example of a routing device 12 shown in FIG. 1. The frequency routing device contains a plurality of input waveguides 26 connected to a free space region 28. A plurality of output waveguides 30 extends from the free space region 28 and is connected to an optical grating 32. The optical grating 32 comprises a plurality of unequal length waveguides which provides a predetermined amount of path length difference between the output waveguides 30 and a corresponding plurality of input waveguides 34 connected to another free space region 36. The free space region 36 is connected to a plurality of output waveguides 38. These frequency routing devices operate as multiplexers and demultiplexers of optical frequencies. The details of their construction and operation are more fully described in the U.S. patents referred to above, the entire contents of which are hereby incorporated by reference into this application. In the case of the frequency routing device 12 in FIG. 1, one of the input waveguides 26 may be connected to the waveguide 14. The plurality of output waveguides 38 are connected to the waveguides $16_1, 16_2, \ldots, 16_N$ in the device of FIG. 1.

We claim:

1. An optical frequency translator, comprising:

a laser cavity defined in a semiconductor wafer;

a frequency routing device formed in the cavity;

a plurality of frequency selective pathways definable in the laser cavity; and means for selectively activating a predetermined one of the frequency selective pathways with optical energy to generate a predetermined frequency such that an input signal to said laser cavity has a frequency translated to said predetermined frequency.

2. The frequency translator of claim 1, further comprising:

a plurality of optical amplifiers in the frequency selective pathways.

3. The frequency translator of claim 2 further comprising:

an input waveguide for injecting an input signal into said laser cavity; and a gain member optically coupling said input waveguide to said frequency routing device.

4. The frequency translator of claim 3 wherein said gain member is selected from the group consisting of an optical amplifier and a saturable absorber.

5. The frequency translator of claim 4 wherein said input waveguide is adapted to further serve as an output waveguide.

6. The frequency translator of claim 4 further comprising:

an output waveguide connected to said gain member for transmitting an output signal from the laser cavity; and a directional coupler for optically coupling said input waveguide to said gain member.

7. An optical frequency translator, comprising:

a laser cavity defined in a semiconductor wafer;

a frequency routing device formed in the cavity, said frequency routing device having an input and a plurality of outputs;

a plurality of optical amplifiers each connected to one of said plurality of outputs;

an input waveguide to said laser cavity for transmitting an optical signal through the laser cavity; and a gain member disposed in said laser cavity and optically coupling said input waveguide to said frequency routing device.

8. The frequency translator of claim 7 further comprising an output waveguide connected to said gain member.

9. The frequency translator of claim 8 further comprising a directional coupler for coupling said input waveguide to said gain member.

10. The frequency translator of claim 9 wherein said gain member comprises a saturable absorber.

11. The frequency translator of claim 9 wherein said gain member comprises an optical amplifier.

12. The frequency translator of claim 9, further comprising:

a control circuit for selectively activating the optical amplifiers.

13. The frequency translator of claim 1, in which the frequency routing device comprises:

at least one input waveguide;

a first free space region connected to the at least one input waveguide;

a plurality of output waveguides connected to the first free space region;

an optical grating connected to the plurality of output waveguides comprising a plurality of unequal length waveguides;

a plurality of input waveguides connected to the optical grating;

a second free space region connected to the plurality of input waveguides connected to the optical grating; and a plurality of output waveguides connected to the second free space region.

14. The frequency translator of claim 7, in which the frequency routing device comprises:

at least one input waveguide;

a first free space region connected to the at least one input waveguide;

a plurality of output waveguides connected to the first free space region;

an optical grating connected to the plurality of output waveguides comprising a plurality of unequal length waveguides;

a plurality of input waveguides connected to the optical grating;

a second free space region connected to the plurality of input waveguides connected to the optical grating; and a plurality of output waveguides connected to the second free space region.

15. An optical frequency translator, comprising:

a frequency routing device formed in a semiconductive wafer;

a laser cavity defined by first and second spaced reflective surfaces formed in the wafer;

a first waveguide having one end located outside the region formed between the first and second surfaces and another end coupled to the frequency routing device;

an optical gain member in series with said first waveguide;

a plurality of waveguides connecting the frequency routing device to the second reflective surface;

a controllable optical amplifier in series with each waveguide in the plurality of waveguides; and means for providing bias current to selected ones of the optical amplifiers for shifting the frequency of an optical input signal to said laser cavity to a different, predetermined output optical frequency.

* * * * *